(12) United States Patent
Clement et al.

(10) Patent No.: US 8,160,529 B1
(45) Date of Patent: Apr. 17, 2012

(54) ADAPTIVE FM/AM RADIO ARCHITECTURE

(75) Inventors: Patrick Clement, Belmont (CH); King Chun Tsai, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 1200 days.

(21) Appl. No.: 11/640,088

(22) Filed: Dec. 15, 2006

Related U.S. Application Data

(60) Provisional application No. 60/779,948, filed on Mar. 7, 2006.

(51) Int. Cl.
*H04B 1/06* (2006.01)

(52) U.S. Cl. ......... 455/255; 455/285; 455/296; 455/302

(58) Field of Classification Search ........... 455/255, 455/188.2, 307, 302, 127.3; 348/614; 375/219; 340/572.2
See application file for complete search history.

(56) References Cited

U.S. PATENT DOCUMENTS

| | | | | |
|---|---|---|---|---|
| 4,912,557 A | * | 3/1990 | Faroudja | 348/614 |
| 5,054,117 A | * | 10/1991 | Cruz et al. | 455/188.2 |
| 5,963,856 A | * | 10/1999 | Kim | 455/307 |
| 6,226,509 B1 | * | 5/2001 | Mole et al. | 455/302 |
| 6,282,249 B1 | * | 8/2001 | Tomesen et al. | 375/327 |
| 6,330,290 B1 | * | 12/2001 | Glas | 375/324 |
| 6,560,449 B1 | * | 5/2003 | Liu | 455/302 |
| 6,694,131 B1 | * | 2/2004 | Lakkis | 455/302 |
| 6,847,255 B2 | * | 1/2005 | Petrovic et al. | 329/323 |
| 6,917,815 B2 | * | 7/2005 | Hajimiri et al. | 455/552.1 |
| 7,184,723 B2 | * | 2/2007 | Sorrells et al. | 455/127.3 |
| 7,184,737 B2 | * | 2/2007 | Liu | 455/302 |
| 7,209,040 B2 | * | 4/2007 | Barink et al. | 340/572.2 |
| 7,565,112 B2 | * | 7/2009 | Ragan | 455/63.1 |
| 2002/0042255 A1 | * | 4/2002 | Prentice | 455/232.1 |
| 2003/0210737 A1 | * | 11/2003 | Linder et al. | 375/219 |
| 2004/0180635 A1 | * | 9/2004 | Choi et al. | 455/113 |
| 2004/0250284 A1 | * | 12/2004 | Dong et al. | 725/68 |
| 2006/0270337 A1 | * | 11/2006 | Ibrahim et al. | 455/3.01 |
| 2006/0286957 A1 | * | 12/2006 | Oishi | 455/323 |

* cited by examiner

*Primary Examiner* — Edward Urban
*Assistant Examiner* — Golam Sorowar

(57) ABSTRACT

A radio frequency (RF) receiver includes a local oscillator (LO) module that receives a control signal and that generates a LO signal at a LO frequency that is based on the control signal, a LO mixer module that generates an intermediate frequency (IF) signal based on a radio frequency (RF) signal and the LO signals, a complex intermediate frequency (IF) mixer module that generates a baseband signal based on the IF signal and an IF oscillator signal, and a channel monitoring module that generates the control signal based on the baseband signal.

45 Claims, 13 Drawing Sheets

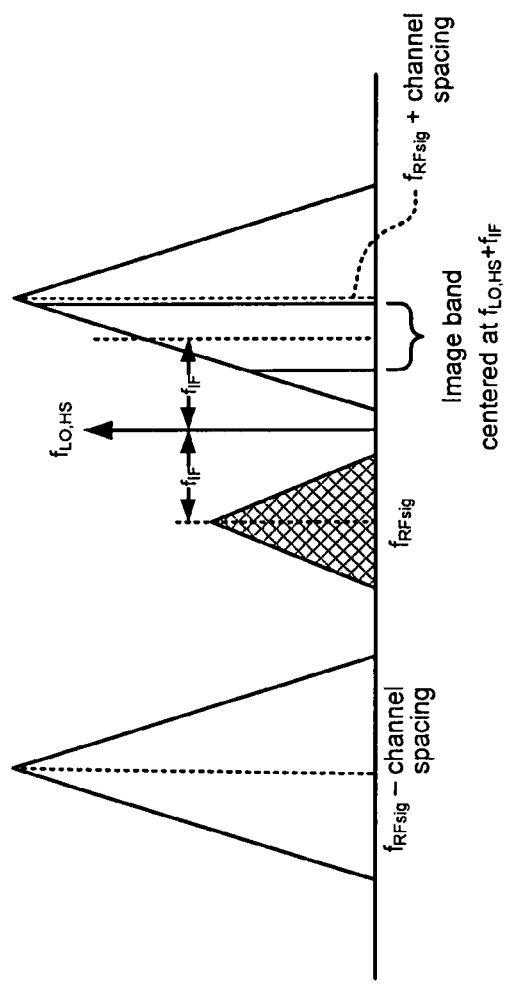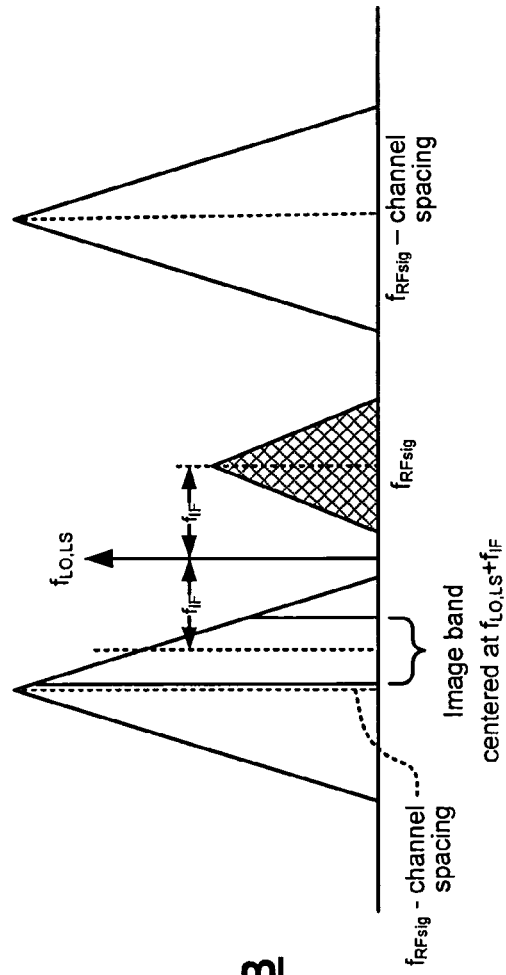
FIG. 2A
FIG. 2B

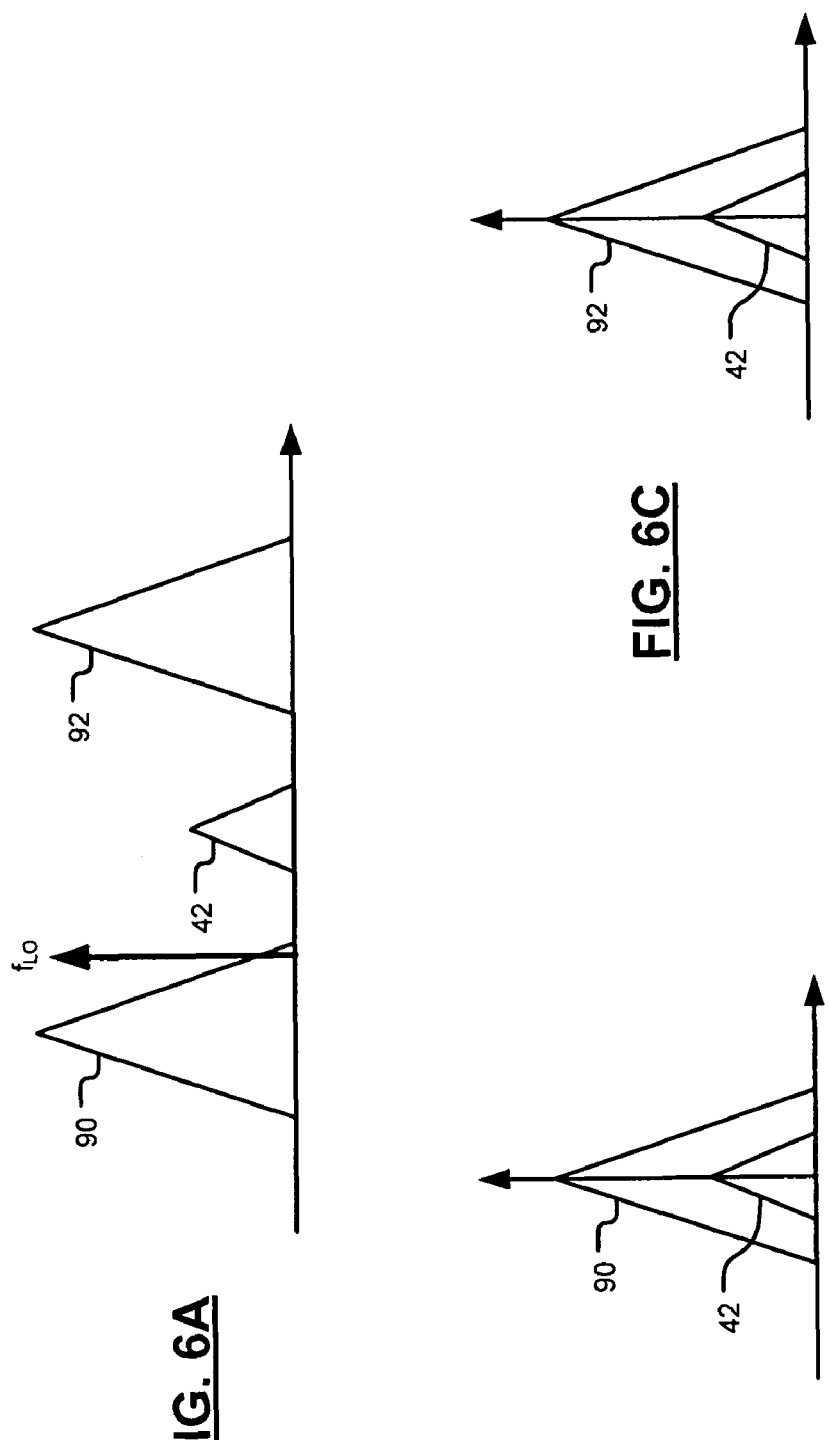

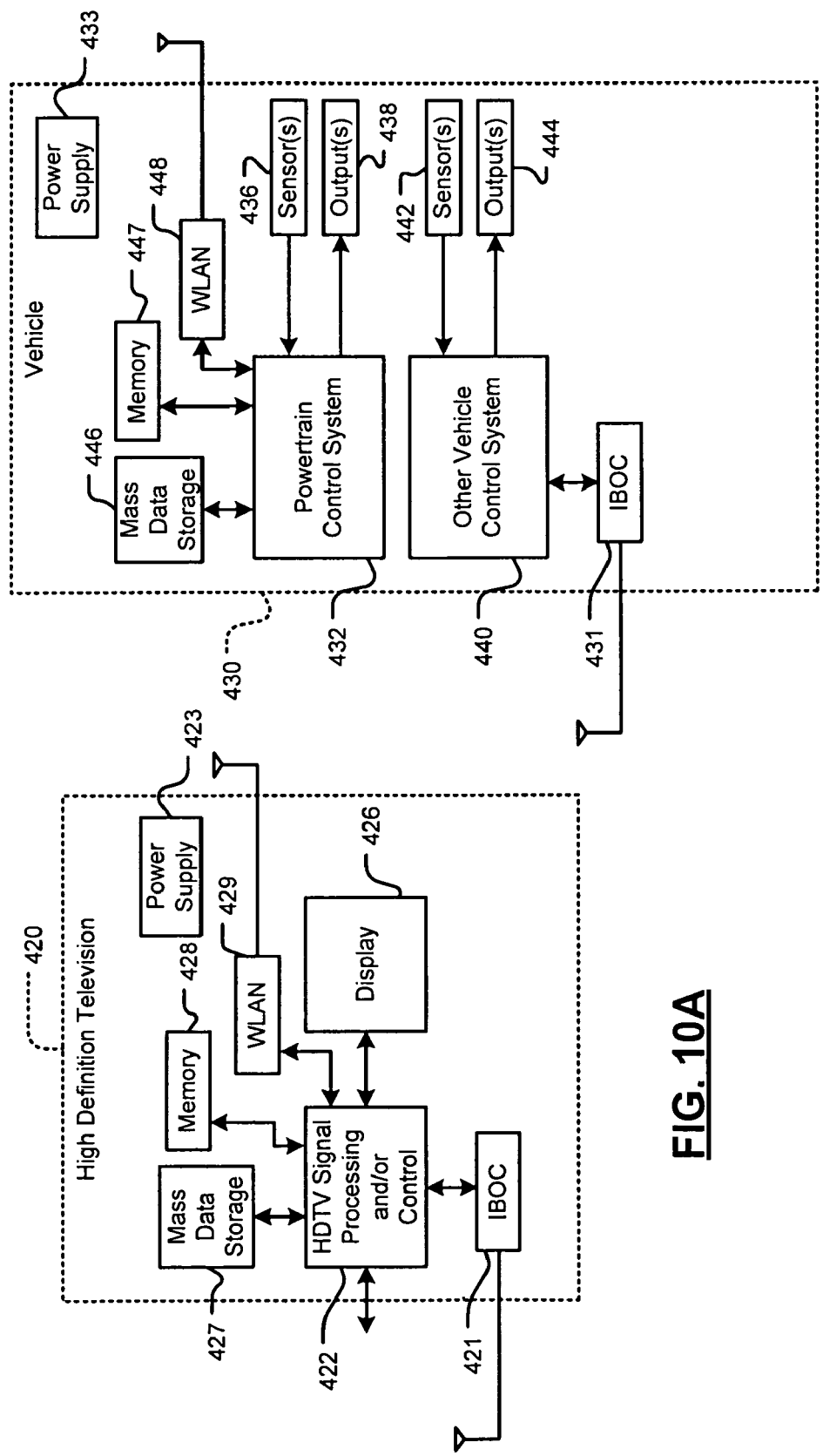

ADAPTIVE FM/AM RADIO ARCHITECTURE

CROSS-REFERENCE TO RELATED APPLICATIONS

This application claims the benefit of U.S. Provisional Application No. 60/779,948 filed on Mar. 7, 2006. The disclosure of the above application is incorporated herein by reference in its entirety.

FIELD

The present disclosure relates to intermediate frequency (IF) mixers for radio frequency (RF) receivers.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Radio frequency receivers can convert a received radio frequency signal to a lower intermediate frequency ($f_{IF}$) prior to demodulating the received signal. The lower $f_{IF}$ simplifies the design of bandpass filters (BPFs) that are used to separate a wanted or selected channel from adjacent channels. For example, analog broadcast FM receivers receive selected channels centered between 88 MHz and 108 MHz and use an IF value of 10.7 MHz. Such relatively high IF frequency can cause the receiver to be too complex and often requires a high quality-factor discrete BPF to remove unwanted adjacent channel energy. To reduce this complexity and cost, and to reduce the size of the circuitry and increase system integration, some applications use a much lower $f_{IF}$ (100-200 kHz) that is compatible with an integrated BPF. An example of such an application includes GSM cellular phones. However reducing $f_{IF}$ increases the difficulty of filtering a DC offset and/or 1/f noise from the received signal.

SUMMARY

A radio frequency (RF) receiver includes a local oscillator (LO) module that receives a control signal and that generates a LO signal at a LO frequency that is based on the control signal, a LO mixer module that generates an intermediate frequency (IF) signal based on a radio frequency (RF) signal and the LO signals, a complex intermediate frequency (IF) mixer module that generates a baseband signal based on the IF signal and an IF oscillator signal, and a channel monitoring module that generates the control signal based on the baseband signal.

In other features the channel monitoring module measures an amplitude of the baseband signal and generates the control signal based on the amplitude. The channel monitoring module measures an amplitude of an image channel in the baseband signal and generates the control signal based on the amplitude. The channel monitoring module measures amplitudes of a selected channel and an image of the selected channel in the baseband signal and generates the control signal based on the amplitudes. The channel monitoring module generates the control signal based on a ratio of the amplitudes. The channel monitoring module includes a look-up table that includes N LO frequencies, wherein N is a positive integer.

In other features the RF receiver includes an analog-to-digital converter that digitizes the IF signal between an output of the LO mixer module and an input of the IF mixer module. The IF signal includes an in-phase (I) signal and a quadrature (Q) signal and the IF oscillator signal includes sine and cosine signals. The complex IF mixer module mixes the sine and cosine signals with the I and Q signals. The IF mixer module includes a recombination module that generates an I output signal based on a sum of the I signal mixed with the cosine signal and the Q signal mixed with the sine signal and that generates a Q output signal based on a difference of the Q signal mixed with the cosine signal and the I signal mixed with the sine signal wherein the baseband signal includes the I output signal and the Q output signal. A gain module equalizes amplitudes of the I and Q signals.

In other features the channel monitoring module sequences the LO frequency though a plurality of frequencies that are greater than and less than a frequency of the RF signal and for each of the plurality of frequencies determines a ratio of an amplitude of a wanted signal in the baseband signal and a image signal in the baseband signal. The channel monitoring module generates a polarity control signal that selectively switches the complex IF mixer module between a high-side injection mode and a low-side injection mode based on whether the LO frequency is greater than or less than the frequency of the RF signal. The channel monitoring module determines the ratio for each of the plurality of frequencies until the ratio exceeds a predetermined ratio. The channel monitoring module sets the LO frequency to the one of the plurality of frequencies that corresponds with a greatest one of the ratios when none of the ratios exceeds the predetermined ratio.

A method of receiving a radio frequency (RF) signal includes receiving a control signal and generating a local oscillator (LO) signal at a LO frequency that is based on the control signal, generating an intermediate frequency (IF) signal based on the RF signal and the LO signals, generating a baseband signal based on the IF signal and an IF oscillator signal, and generating the control signal based on the baseband signal.

In other features the method includes measuring an amplitude of the baseband signal and generating the control signal based on the amplitude. The method includes measuring an amplitude of an image channel in the baseband signal and generating the control signal based on the amplitude. The method includes measuring amplitudes of a selected channel and an image of the selected channel in the baseband signal and generating the control signal based on the amplitudes. The method includes generating the control signal based on a ratio of the amplitudes. The method includes selecting the LO frequency from N LO frequencies, wherein N is a positive integer.

In other features the method includes digitizing the IF signal between generating the IF signal and generating the baseband signal. The IF signal includes an in-phase (I) signal and a quadrature (Q) signal and the IF oscillator signal includes sine and cosine signals. Generating the baseband signal includes mixing the sine and cosine signals with the I and Q signals. The method includes generating an I output signal based on a sum of the I signal mixed with the cosine signal and the Q signal mixed with the sine signal and generating a Q output signal based on a difference of the Q signal mixed with the cosine signal and the I signal mixed with the sine signal and wherein the baseband signal includes the I output signal and the Q output signal. The method includes sequencing the LO frequency though a plurality of frequencies that are greater than and less than a frequency of the RF signal and for each of the plurality of frequencies determining a ratio of an amplitude of a wanted signal in the baseband signal and an amplitude of an image signal in the baseband signal.

In other features the method includes generating the baseband signal in one of a high-side injection mode and a low-side injection mode based on whether the LO frequency is greater than or less than the frequency of the RF signal. The method includes determining the ratio for each of the plurality of frequencies until the ratio exceeds a predetermined ratio. The method includes setting the LO frequency to the one of the plurality of frequencies that corresponds with a greatest one of the ratios when none of the ratios exceeds the predetermined ratio.

A radio frequency (RF) receiver includes local oscillator (LO) means for receiving a control signal and generating a LO signal at a LO frequency that is based on the control signal, LO mixer means for generating an intermediate frequency (IF) signal based on a radio frequency (RF) signal and the LO signals, complex intermediate frequency (IF) mixer means for generating a baseband signal based on the IF signal and an IF oscillator signal, and channel monitoring means for generating the control signal based on the baseband signal.

In other features the channel monitoring means measures an amplitude of the baseband signal and generates the control signal based on the amplitude. The channel monitoring means measures an amplitude of an image channel in the baseband signal and generates the control signal based on the amplitude. The channel monitoring means measures amplitudes of a selected channel and an image of the selected channel in the baseband signal and generates the control signal based on the amplitudes. The channel monitoring means generates the control signal based on a ratio of the amplitudes. The channel monitoring means includes a look-up table that includes N LO frequencies, wherein N is a positive integer.

In other features analog-to-digital converter means digitize the IF signal between an output of the LO mixer means and an input of the IF mixer means. The IF signal includes an in-phase (I) signal and a quadrature (Q) signal and the IF oscillator signal includes sine and cosine signals. The complex IF mixer means mixes the sine and cosine signals with the I and Q signals. The IF mixer means includes a recombination means for generating an I output signal based on a sum of the I signal mixed with the cosine signal and the Q signal mixed with the sine signal and for generating a Q output signal based on a difference of the Q signal mixed with the cosine signal and the I signal mixed with the sine signal wherein the baseband signal includes the I output signal and the Q output signal. Gain means equalize amplitudes of the I and Q signals.

In other features the channel monitoring means sequences the LO frequency though a plurality of frequencies that are greater than and less than a frequency of the RF signal and for each of the plurality of frequencies determines a ratio of an amplitude of a wanted signal in the baseband signal and a image signal in the baseband signal. The channel monitoring means generates a polarity control signal that selectively switches the complex IF mixer module between a high-side injection mode and a low-side injection mode based on whether the LO frequency is greater than or less than the frequency of the RF signal. The channel monitoring means determines the ratio for each of the plurality of frequencies until the ratio exceeds a predetermined ratio. The channel monitoring means sets the LO frequency to the one of the plurality of frequencies that corresponds with a greatest one of the ratios when none of the ratios exceeds the predetermined ratio.

A computer program stored on a computer readable medium and is executed by one or more processors. The computer program receives a radio frequency (RF) signal and includes receiving a control signal and generating a local oscillator (LO) signal at a LO frequency that is based on the control signal, generating an intermediate frequency (IF) signal based on the RF signal and the LO signals, generating a baseband signal based on the IF signal and an IF oscillator signal, and generating the control signal based on the baseband signal.

In other features the computer program includes measuring an amplitude of the baseband signal and generating the control signal based on the amplitude. The computer program includes measuring an amplitude of an image channel in the baseband signal and generating the control signal based on the amplitude. The computer program includes measuring amplitudes of a selected channel and an image of the selected channel in the baseband signal and generating the control signal based on the amplitudes. The computer program includes generating the control signal based on a ratio of the amplitudes. The computer program includes selecting the LO frequency from N LO frequencies, wherein N is a positive integer.

In other features the computer program includes digitizing the IF signal between generating the IF signal and generating the baseband signal. The IF signal includes an in-phase (I) signal and a quadrature (Q) signal and the IF oscillator signal includes sine and cosine signals. Generating the baseband signal includes mixing the sine and cosine signals with the I and Q signals. The computer program includes generating an I output signal based on a sum of the I signal mixed with the cosine signal and the Q signal mixed with the sine signal and generating a Q output signal based on a difference of the Q signal mixed with the cosine signal and the I signal mixed with the sine signal and wherein the baseband signal includes the I output signal and the Q output signal. The computer program includes sequencing the LO frequency though a plurality of frequencies that are greater than and less than a frequency of the RF signal and for each of the plurality of frequencies determining a ratio of an amplitude of a wanted signal in the baseband signal and an amplitude of an image signal in the baseband signal.

In other features the computer program includes generating the baseband signal in one of a high-side injection mode and a low-side injection mode based on whether the LO frequency is greater than or less than the frequency of the RF signal. The computer program includes determining the ratio for each of the plurality of frequencies until the ratio exceeds a predetermined ratio. The computer program includes setting the LO frequency to the one of the plurality of frequencies that corresponds with a greatest one of the ratios when none of the ratios exceeds the predetermined ratio.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A-2B are frequency domain plots of a channel;

FIGS. 6A-6C are frequency domain plots of channel image measurements that are performed by the method of FIGS. 5A and 5B;

FIG. 10A is a functional block diagram of a high definition television;

FIG. 10B is a functional block diagram of a vehicle control system;

DETAILED DESCRIPTION

Figure 1:
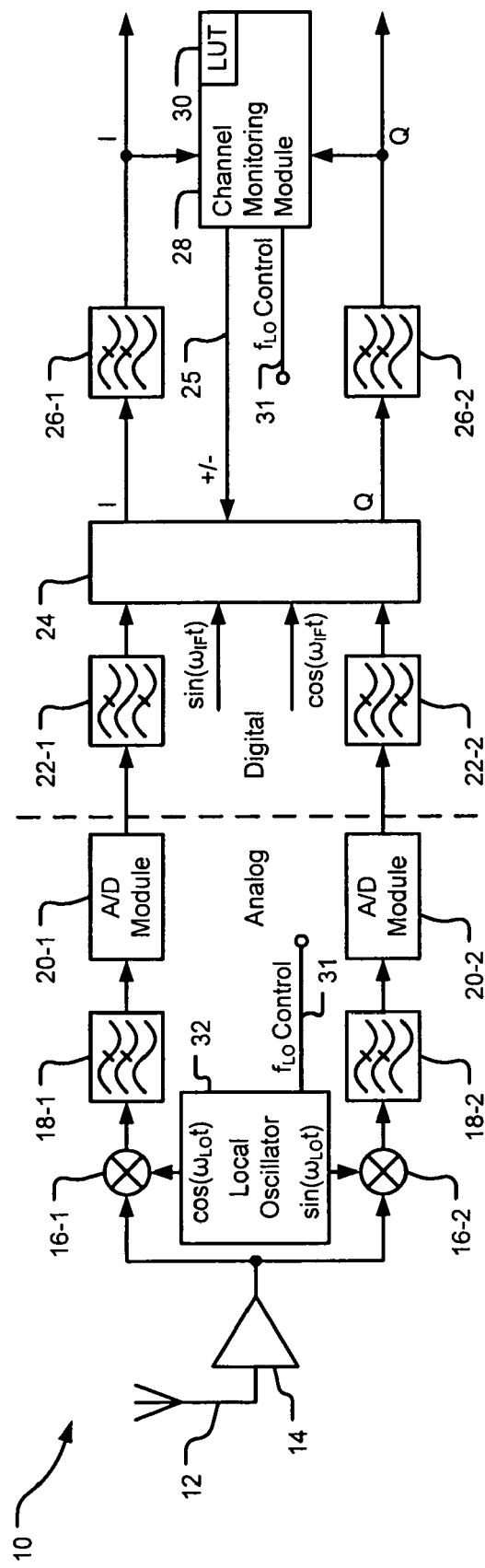
FIG. 1 is a functional block diagram of a radio frequency (RF) receiver with an adjustable intermediate frequency (IF)

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Referring now to FIG. 1 a functional block diagram is shown of a radio frequency (RF) receiver 10. In some embodiments receiver 10 is included in an analog/digital AM/FM receiver. Receiver 10 employs variable intermediate frequency (IF) mixing and a variable local oscillator (LO) frequency ($f_{LO}$) to optimize rejection between an image channel and the combination of 1/f and DC offset. The IF frequency is represented by the notation $f_{IF}$ and the LO frequency is represented by the notation $f_{LO}$.

Receiver 10 includes an antenna 12 that receives and communicates an RF signal at frequency $f_{RFsig}$ to a low noise amplifier (LNA) 14. LNA 14 communicates the RF signal to in-phase (I) and quadrature (Q) local oscillator mixers 16-1, 16-2, which are referred to collectively as local oscillator mixers 16. Local oscillator mixers 16 mix the RF signal with respective signals $\cos(\omega_{LO}t)$ and $\sin(\omega_{LO}t)$ where $\omega_{LO}$ represents a period of the local oscillator signals and t represents time. Outputs of local oscillator mixers 16 communicate with respective inputs of low pass filters 18. Low pass filters 18 provide anti-alias filtering for analog to digital converters (A/Ds) 20. A/Ds 20 generate digital signals based on respective signals from low pass filters 18. In some embodiments a sample frequency of A/Ds 20 is about 12 MHz.

A/Ds 20 communicate the digital signals to respective bandpass filters 22. A low cutoff frequency of bandpass filters 22 can be selected based on predetermined limits for DC offset and 1/f noise in the digital signals. A high cutoff frequency of bandpass filters 22 can be selected to reduce sampling noise from A/Ds 20. Outputs of bandpass filters 22 communicate with inputs of a complex IF mixer 24. Complex IF mixer 24 generates I and Q signals based on signals that are received from bandpass filters 22, a polarity control signal 25, and $\sin(\omega_{IF}t)$ and $\cos(\omega_{IF}t)$ signals, wherein $\omega_{IF}$ is the period of the IF signals. Complex IF mixer 24 is shown in more detail in FIG. 4. Low pass filters 26 generate I and Q signals based on respective output signals from complex IF mixer 24 and a polarity control signal 25.

A channel monitoring module 28 monitors the I and Q signals and generates polarity control signal 25 and an $f_{LO}$ control signal 31. $f_{LO}$ control signal 31 establishes the frequencies of the $\cos(\omega_{LO}t)$ and $\sin(\omega_{LO}t)$ signals, which are generated by a local oscillator 32. Channel monitoring module 28 can establish $f_{LO}$ based on look-up table 30 and/or a method that is described below.

In normal operation the values of $f_{LO}$ and $f_{IF}$ are chosen in accordance with the desired signal frequency $f_{RFsig}$. Assuming $f_{LO}$ and $f_{IF}$ are positive, two modes of operation are possible depending on the configuration of complex IF mixer 24: In a first case (low-side injection), $f_{LO}$ is injected below $f_{RFsig}$ such that $f_{RFsig}=f_{LO}+f_{IF}$. In a second case (high-side injection), $f_{LO}$ is injected above $f_{RFsig}$ such that $f_{RFsig}=f_{LO}-f_{IF}$.

Ideally only the signal at $f_{RFsig}$ is converted down to baseband. However, due to component mismatches, receiver 10 is also sensitive to energy at the opposite side of the LO (known as the image band). If energy is present in the image band at the input of LNA 14, part of that energy leaks into the receiver output and the desired signal. For an integrated receiver, an image rejection ratio (IRR) can be defined as the ratio between the desired signal and image band sensitivity. An IRR of 30-40 dB can usually be achieved, yet such IRR values are often inadequate if the image energy originates from a near transmitter with power much higher than that of the desired signal.

A method described herein includes an optimization routine to minimize image-related degradation. The method adaptively configures receiver 10 into high-side and low-side injection modes and varies the value of the IF frequency to optimize a trade off between image-related corruption and other sources of degradation such as DC offset, 1/f noise, IIP2 issues, and the like.

Referring now to FIG. 2A, a spectrum diagram illustrates the relationship between the desired signal frequency and the image band in the case of high-side injection mode. In this case, the desired signal is at $f_{LO,HS}-f_{IF}$ and the image band is located at $f_{LO,HS}+f_{IF}$. Consequently, part of the upper adjacent channel overlapping with the image band corrupts the desired signal.

Referring now to FIG. 2B, a spectrum diagram illustrates the relationship between the desired signal frequency and the image band in the case of low-side injection mode. In this case, a different LO frequency ($f_{LO,LS}$) is required and the desired signal is at $f_{LO,LS}+f_{IF}$ and the image band is located at $f_{LO,LS}-f_{IF}$. Consequently, part of the lower adjacent channel that overlaps with the image band corrupts the desired signal.

In practice one of the upper and lower adjacent channels will likely be weaker in power than the other. Image-related corruption can therefore be minimize by adaptively choosing the injection mode such that the LO frequency is located at the same side of the weaker adjacent channel. The method shown in FIGS. 5A-5B details such adaptation.

From FIG. 2A it can also be seen that the choice of the IF frequency can impact the image-related degradation. Lowering $f_{IF}$ shifts the image band away from the center of the upper adjacent channel and reduces the image-related degradation.

On the other hand, lowering $f_{IF}$ also worsens other sources of degradation related to DC offset, 1/f noise and IIP2 issues. This issue can be seen in FIG. 3, which shows in frequency domain at baseband (i.e. at RX output) the signal/adjacent channel composition corresponding to FIG. 2A.

Figure 3:
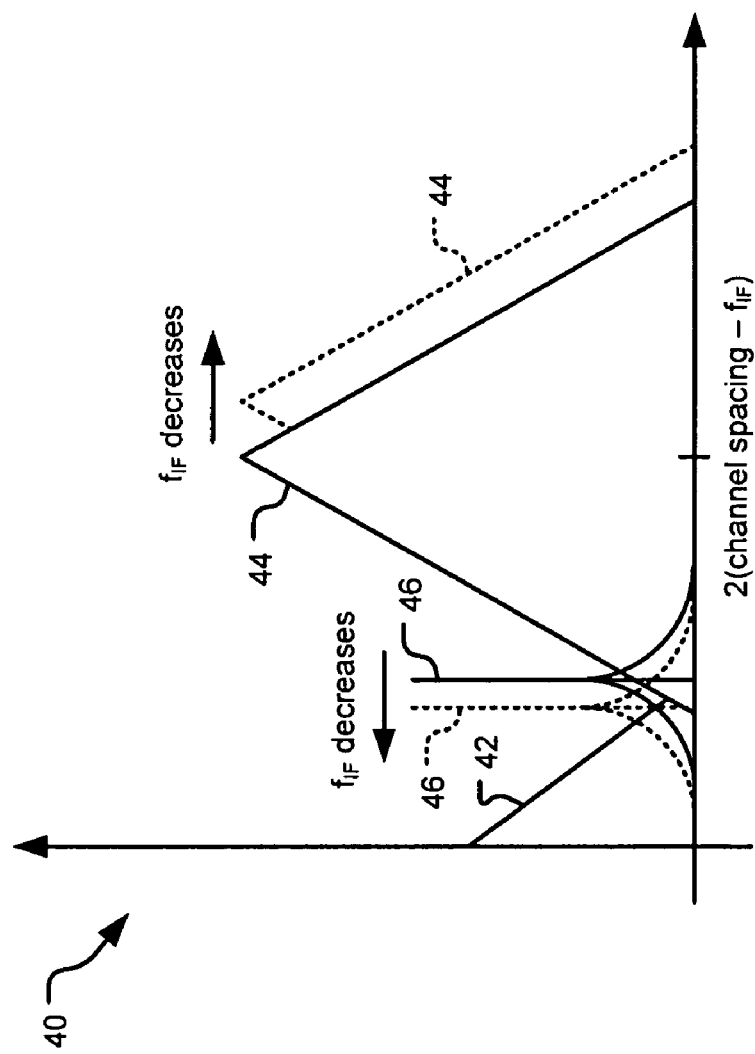
FIG. 3 is a frequency domain plot that show effects of 1/f noise and an image channel.

In FIG. 3 signal components of a selected channel are shown generally at 42. Signal components of an image of selected channel 42 are shown generally by an image channel 44. Signal components of DC offset and 1/f noise components are shown generally at 46.

Frequency domain plot 40 shows that as $f_{IF}$ decreases the components of DC offset and 1/f noise 46 increasingly overlap the components of selected channel 42. Removing the DC offset and 1/f noise 46 without distorting selected channel 42 therefore becomes more difficult as $f_{IF}$ decreases.

On the other hand, the components of image channel 44 move further away from selected channel 42 as $f_{IF}$ decreases. Removing image channel 44 without distorting selected channel 42 therefore becomes simpler as $f_{IF}$ decreases. Frequency domain plot 40 therefore shows a compromise between removing the 1/f noise and DC component at 46 and removing image channel 44.

Figure 4:
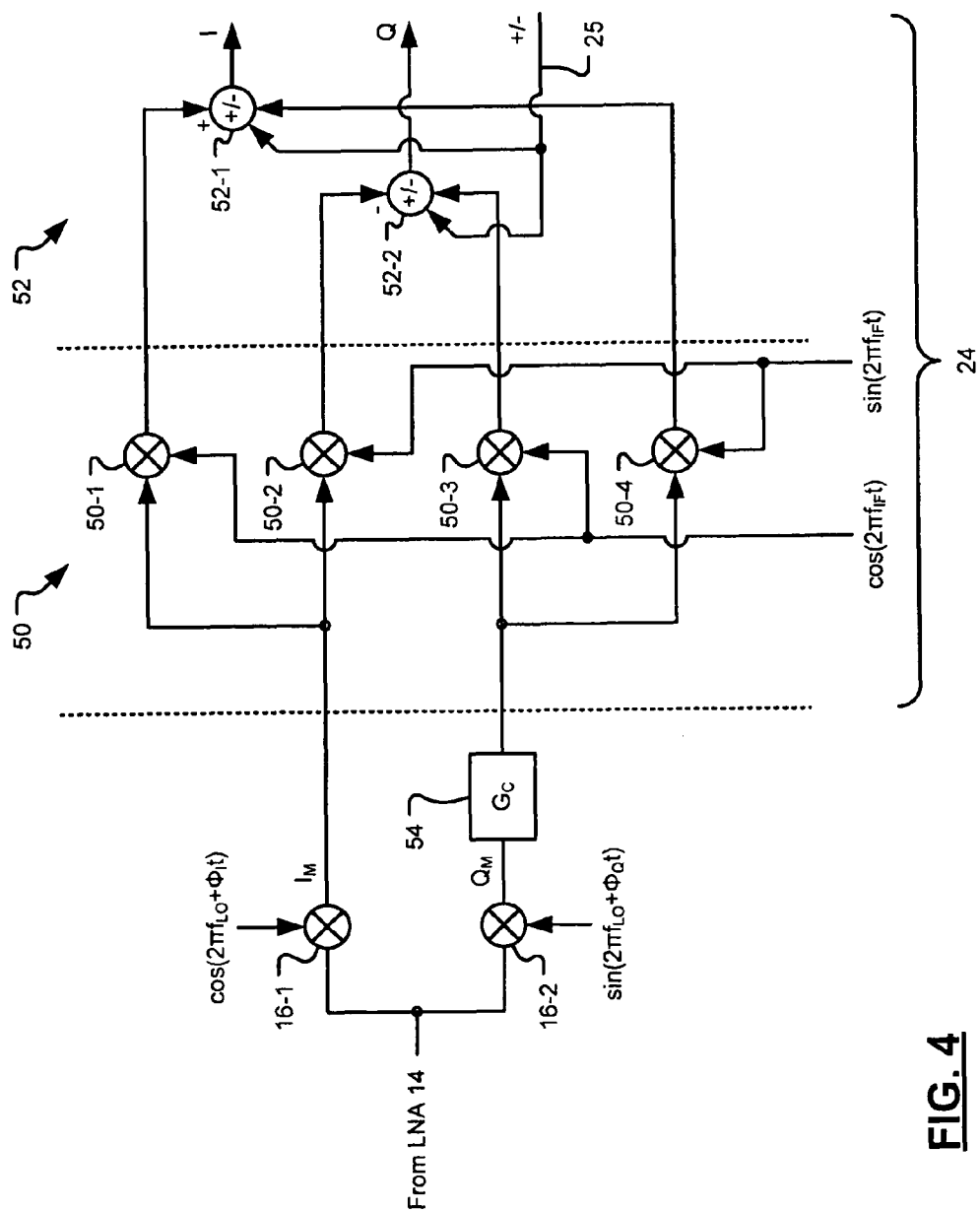
FIG. 4 is a function block diagram of an IF mixer stage of the RF receiver of FIG. 1.

Referring now to FIG. 4, a functional block diagram is shown of complex IF mixer 24. Complex IF mixer 24 include features that facilitate determining the amplitude of image channel 44. The method of FIGS. 5A-5B determines the optimal value of $f_{LO}$ based on the amplitude of image channel 44.

Complex IF mixer 24 includes a mixer module 50 and a recombination module 52. Mixer module 50 includes four mixers 50-1, . . . , 50-4, which are collectively referred to as mixers 50. First and second mixers 50-1 and 50-2 mix the input I component signal with the IF signals $\cos(2\pi f_{IF} t)$ and $\sin(2\pi f_{IF} t)$, respectively. Third and fourth mixers 50-3 and 50-4 mix the input Q component signal with the IF signals $\cos(2\pi f_{IF} t)$ and $\sin(2\pi f_{IF} t)$, respectively.

Recombination module 52 includes a first summing module 52-1 and a second summing module 52-2. First summing module 52-1 generates the I signal based on the output of mixers 50-1 summed with the output of mixer 50-4. The sign of the signal from the output of mixer 50-4 can be changed based on polarity control signal 25.

Second summing module 52-2 generates the Q signal based on a difference between the output of mixer 50-3 and the output of mixer 50-2. The sign of the signal from the output of mixer 50-3 can be changed based on polarity control signal 25.

FIG. 4 also shows elements that can be used to equalize the I and Q signals upstream of complex IF mixers 24. A gain compensation module 54 can compensate the amplitude of the $Q_M$ signal that is communicated from local oscillator mixers 16. A gain $G_C$ of gain compensation module 54 can be adjusted such that the amplitude of the Q signal at the output of gain compensation module 54 is equal to the amplitude of the $I_M$ signal that is communicated from local oscillator mixers 16. A phase shift between the $I_M$ and $Q_M$ signals can be corrected to 90 degrees by adding phase shift terms $\phi_I t$ and/or $\phi_Q t$ to the respective cosine and/or sine signal inputs of local oscillator mixers 16.

Figure 5A:
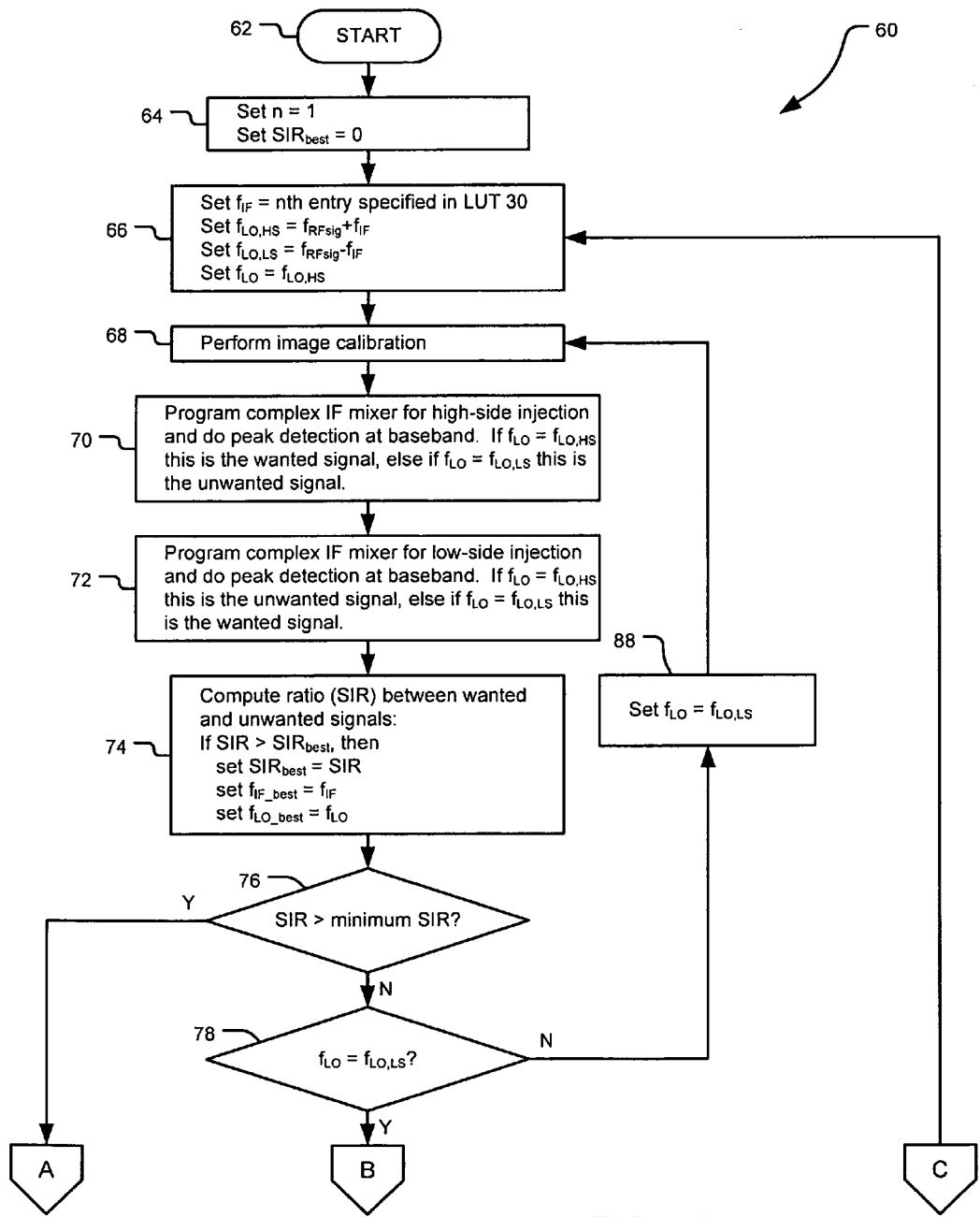
FIGS. 5A and 5B are a flowchart of a method for determining the IF in the RF receiver of FIG. 1.
Figure 5B:
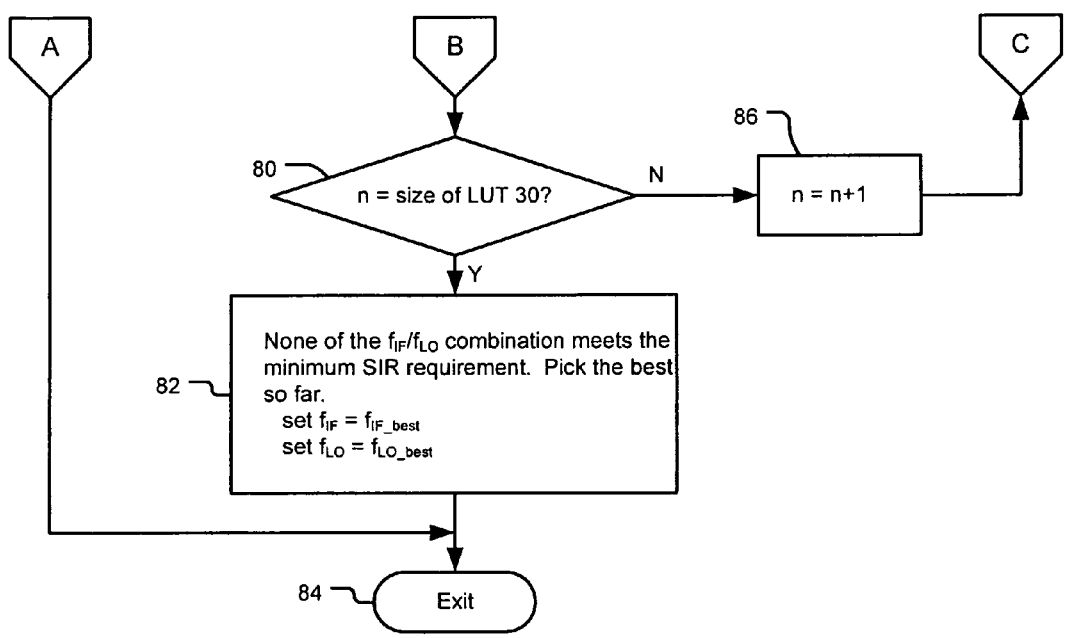

Referring now to FIGS. 5A-5B, a method 60 is shown that can be used to determine an optimum value for $f_{IF}$. Method 60 can be implemented as computer instructions that are stored in a memory and executed by a processor. In some embodiments the processor and memory can be included in channel monitoring module 28. FIGS. 6A-6C illustrate frequency components of the RF spectrum (FIG. 6A) and baseband spectrums (FIGS. 6B and 6C) during various steps of method 60.

Referring to FIGS. 5A-5B, control enters at block 62 and immediately proceeds to block 64. In block 64 control sets a variable n equal to 1 and initializes a variable $SIR_{best}$ to 0. Control then proceeds to block 66 and sets $f_{IF}$ to an $n^{th}$ entry specified in LUT 30, sets $f_{LO,HS}$ to $f_{RFsig} + f_{IF}$, sets $f_{LO,LS}$ to $f_{RFsig} - f_{IF}$, and sets $f_{LO} = f_{LO,HS}$. Control then proceeds to block 68 and performs image calibration. Control then proceeds to block 70 and programs complex IF mixer 24 for high-side injection and performs peak detection at baseband. If $f_{LO} = f_{LO,HS}$ then this is the wanted signal. Otherwise, if $f_{LO} = f_{LO,LS}$ then this is the unwanted signal. Control then proceeds to block 72 and programs complex IF mixer 24 for low-side injection and performs peak detection at baseband. If $f_{LO} = f_{LO,HS}$ then this is the unwanted signal. Otherwise, if $f_{LO} = f_{LO,LS}$ then this is the wanted signal. Control then proceeds to block 74 and computes a ratio SIR between wanted and unwanted signals. If $SIR > SIR_{best}$ then control sets $SIR_{best}$ to the present value of SIR, sets a variable $f_{IF\_best}$ to the present value of $f_{IF}$, and sets a variable $f_{LO\_best}$ to the present value of $f_{LO}$. Control then proceeds to decision block 76.

In decision block 76 control determines whether the present value of SIR is greater than a predetermined minimum SIR. If so, then control returns to other processes via exit block 84. If the present value of SIR is less than the predetermined minimum SIR in decision block 76 then control branches to decision block 78. In decision block 78 control determines whether the present value of $f_{LO}$ is equal to $f_{LO,LS}$. If f is not equal to f then control branches to block 88 and sets f to $f_{LO,LS}$ before repeating blocks 68 through 78. If $f_{LO}$ is equal to $f_{LO,LS}$ then control branches to block 80 and determines whether the present value of n has reached the size of LUT 30. If not, then control branches to block 86 and increments n before returning to block 66. If the present value n has reached the size of LUT 30 then control branches form decision block 80 to block 82. In block 82 control declares that none of the combinations of $f_{IF}$ and $f_{LO}$ meet the minimum predetermined SIR. Control then selects the best combination by setting $f_{IF}$ to $f_{IF\_best}$ and setting $f_{LO}$ to $f_{LO\_best}$. Control then returns to other processes via exit block 84.

Referring now to FIGS. 7A-9C, frequency domain plots are shown for various values of $f_{IF}$. The frequency domains plots illustrate the issues corresponding to various values of $f_{IF}$ with respect to 1/f noise attenuation, image rejection, and levels of the adjacent channels 90 vs. levels of selected channel 42. In some embodiments the trade-offs can be focused on filtering 1/f noise vs. image rejection required by adjacent channel 90.

Figure 7A:
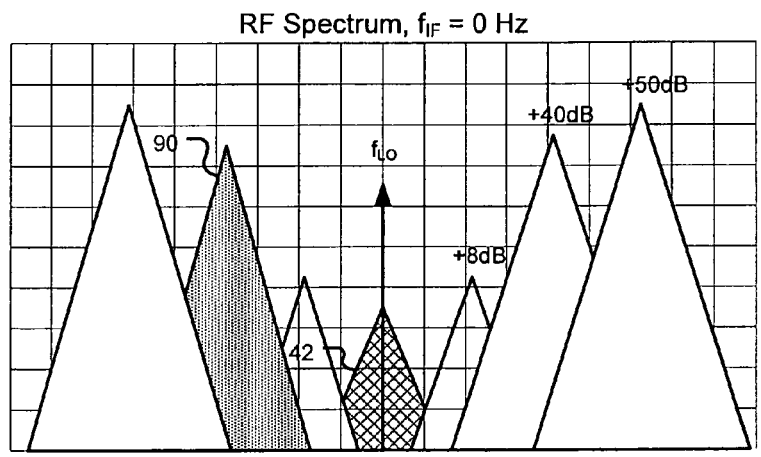
FIGS. 7A-7B are frequency domain plots of the RF carrier and baseband for $f_{IF}$=0 Hz.
Figure 7B:
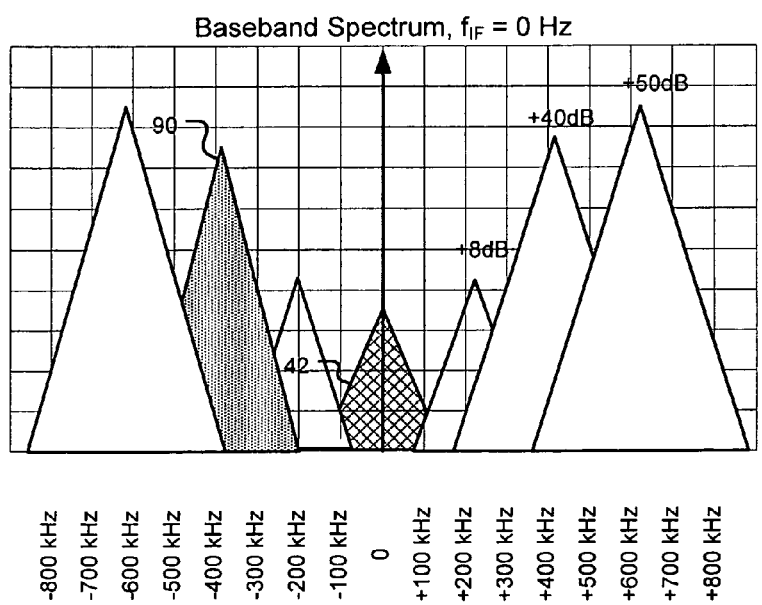

FIGS. 7A and 7B depict respective frequency domain plots for the broadcast spectrum and baseband spectrum for $f_{IF} = 0$ Hz. It can be seen that the DC offset are estimated and subtracted instead of being filtered since the DC offset and 1/f noise are centered in selected channel 42. Receiver 10 is also sensitive to second-order non-linearity (IP2) issues when $f_{IF} = 0$ Hz. The IP2 issues can also be exasperated as the power supply voltage applied to receiver 10 is lowered to reduce power consumption. On the other hand there is no image channel issue when $f_{IF} = 0$ Hz.

Figure 8A:
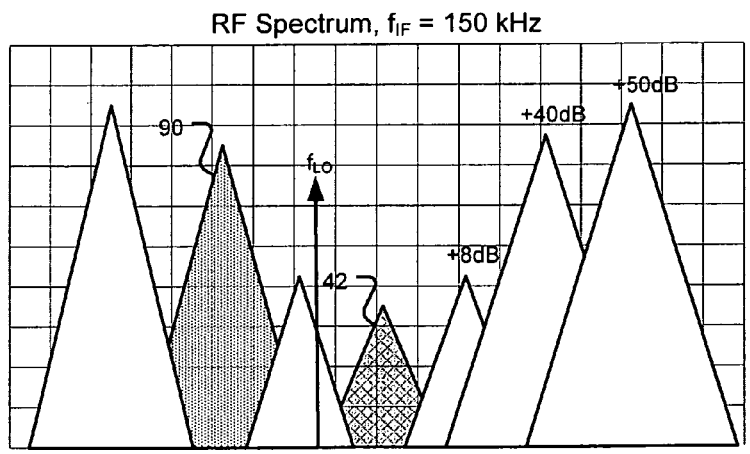
FIGS. 8A-8C are frequency domain plots of the RF carrier, intermediate frequency, and baseband for $f_{IF}$=150 KHz.
Figure 8B:
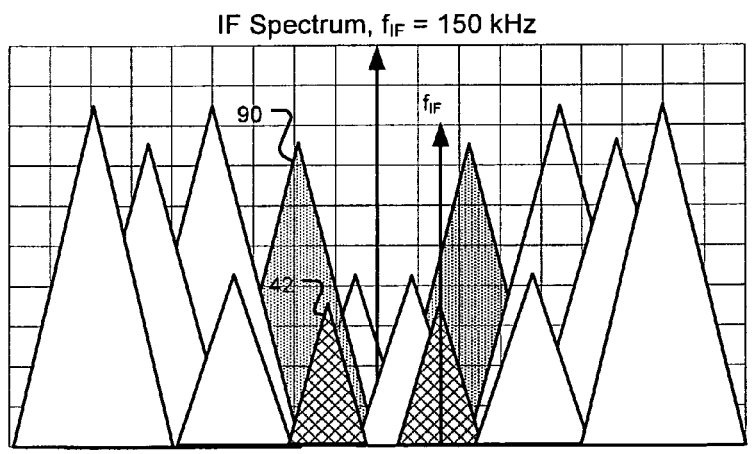
Figure 8C:
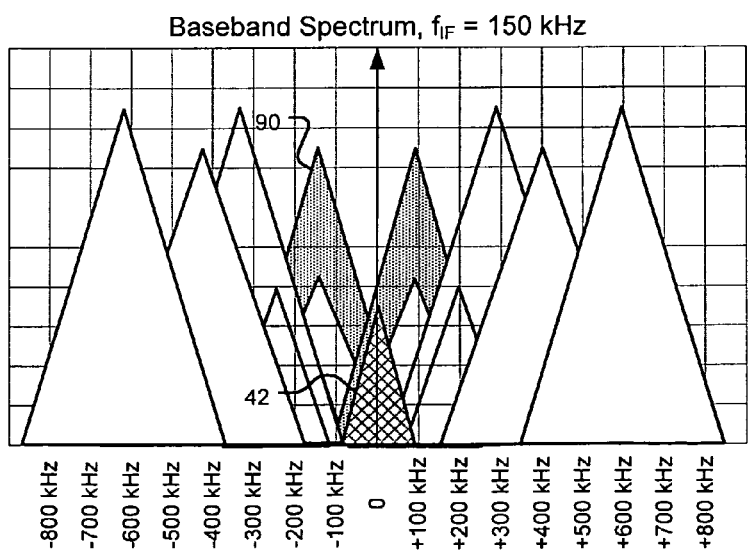

Referring now to FIGS. 8A-8C, frequency domain plots are shown at $f_{IF} = 150$ kHz for the broadcast, IF, and baseband spectrums, respectively. At $f_{IF} = 150$ kHz the DC offset can be fully filtered while preserving selected channel. 1/f noise is filtered up to 50 kHz and images are parts of the first adjacent and part of the second adjacent opposite channels. In some embodiments the image rejection is 54 dB with respect to the second opposite adjacent channel when receiver 10 receives analog FM broadcast signals. The IP2 sensitivity issues are reduced when compared to $f_{IF}=0$ Hz but there is increased sensitivity with respect I and Q phase errors in the low-pass filters 18.

Figure 9A:
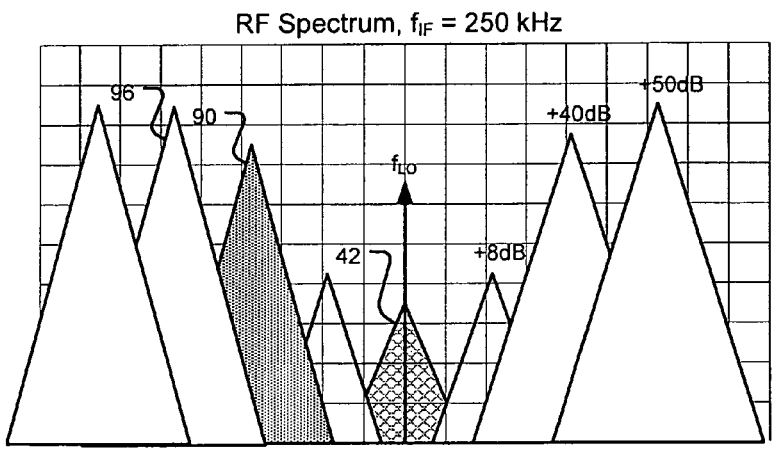
FIGS. 9A-9C are frequency domain plots of the RF carrier, intermediate frequency, and baseband for $f_{IF}$=250 KHz.
Figure 9B:
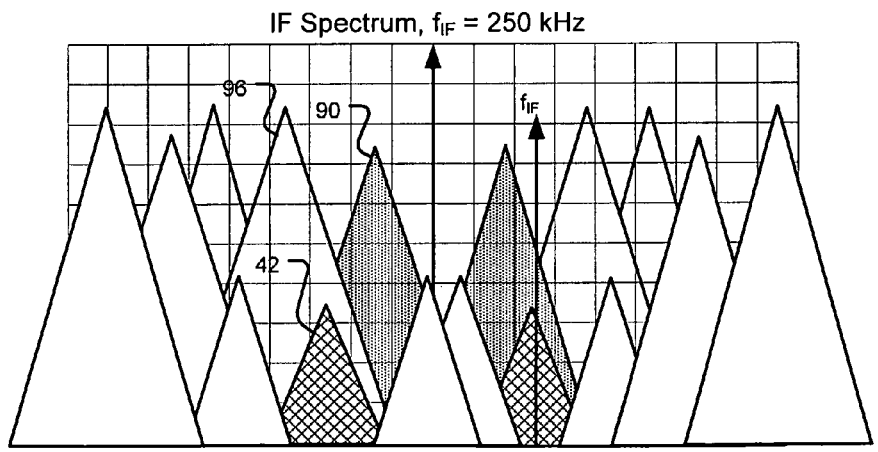
Figure 9C:
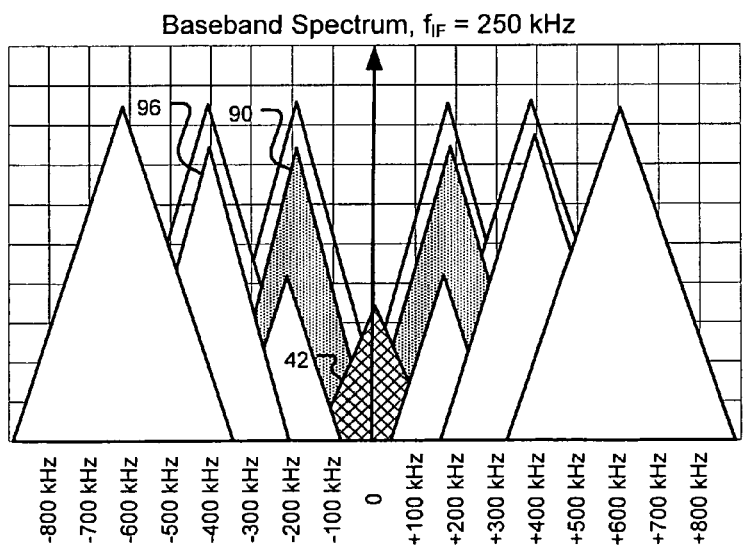

Referring now to FIGS. 9A-9C frequency domain plots are shown at $f_{IF}=250$ kHz for the broadcast, IF, and baseband spectrums, respectively. At $f_{IF}=250$ kHz the DC offset can be fully filtered while preserving selected channel. 1/f noise is filtered up to 150 kHz and images are the second and third opposite adjacent channels. In some embodiments the image rejection is 54 dB with respect to the second opposite adjacent channel and 64 dB with respect to the third opposite adjacent channel when receiver 10 receives analog FM broadcast signals. The IP2 sensitivity issues are reduced when compared to $f_{IF}=0$ Hz and there is an even larger increased sensitivity with respect I and Q phase errors in the low-pass filters 18 when compared with $f_{IF}=150$ kHz.

Figure 10C:
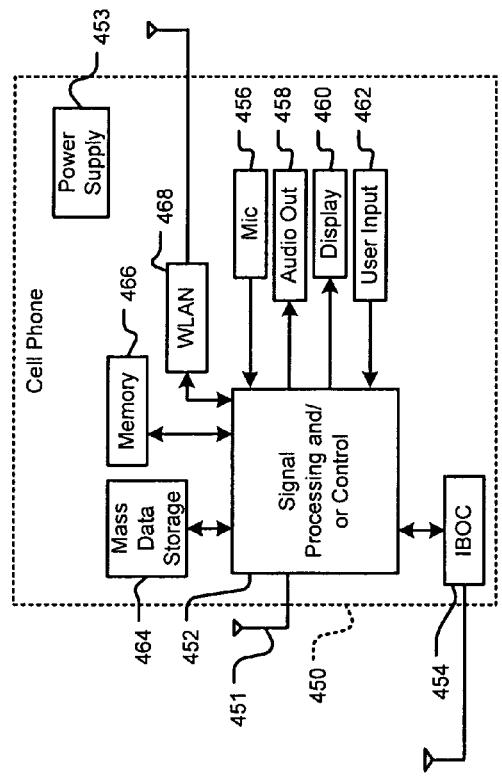
FIG. 10C is a functional block diagram of a cellular phone.

Referring now to FIGS. 10A-10E, various exemplary implementations are shown of digital AM/FM receivers that employ the adaptive IF circuits and methods that are described above. Referring now to FIG. 10A, a receiver 421 can be implemented in a high definition television (HDTV) 420. The HDTV 420 receives HDTV input signals in either a wired or wireless format and generates HDTV output signals for a display 426. In some implementations, a signal processing circuit and/or a control circuit 422 and/or other circuits (not shown) of the HDTV 420 may process data, perform coding and/or encryption, perform calculations, format data and/or perform any other type of HDTV processing that may be required. The receiver 421 may communicate with the signal processing circuit and/or a control circuit 422.

The HDTV 420 may communicate with mass data storage 427 that stores data in a nonvolatile manner such as optical and/or magnetic storage devices such as hard disk drives (HDDs). At least one HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN interface 429. The HDTV 420 may also include a power supply 423.

Referring now to FIG. 10B, a receiver 431 may be implemented in a vehicle 430. The vehicle 430 includes a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The receiver 431 may communicate with other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices such as HDDs and/or DVDs. At least one HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN interface 448. The control system 440 may also include mass data storage, memory and/or a WLAN interface (all not shown). The vehicle 430 may also include a power supply 433.

Referring now to FIG. 10C, a receiver 454 can be implemented in a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions. The receiver 481 may communicate with the signal processing and/or control circuits 452

The cellular phone 450 may communicate with mass data storage 464 that stores data in a nonvolatile manner such as optical and/or magnetic storage devices such as HDDs and/or DVDs. At least one HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468. The cellular phone 450 may also include a power supply 483.

Figure 10D:
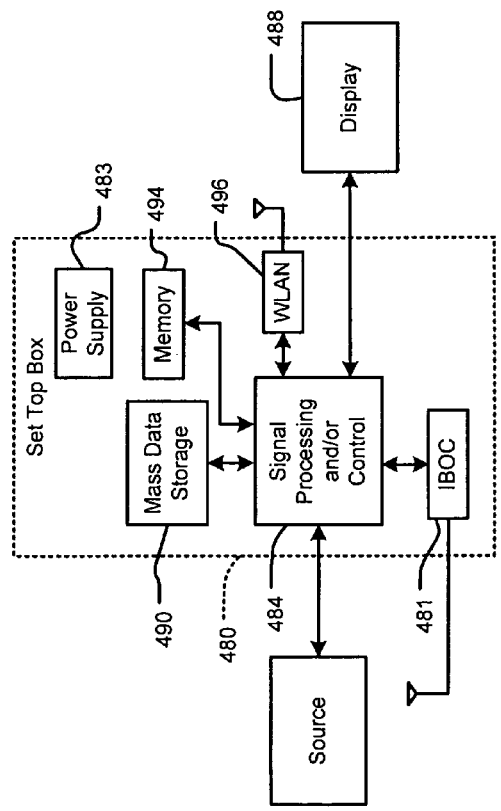
FIG. 10D is a functional block diagram of a set top box.

Referring now to FIG. 10D, a receiver 481 can be implemented in a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function. The receiver 481 may communicate with the signal processing and/or control circuits 484 and/or other circuits.

The set top box 480 may communicate with mass data storage 490 that stores data in a nonvolatile manner. The mass data storage 490 may include optical and/or magnetic storage devices such as HDDs and/or DVDs. At least one HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496. The set-top box 480 may also include a power supply 483.

Figure 10E:
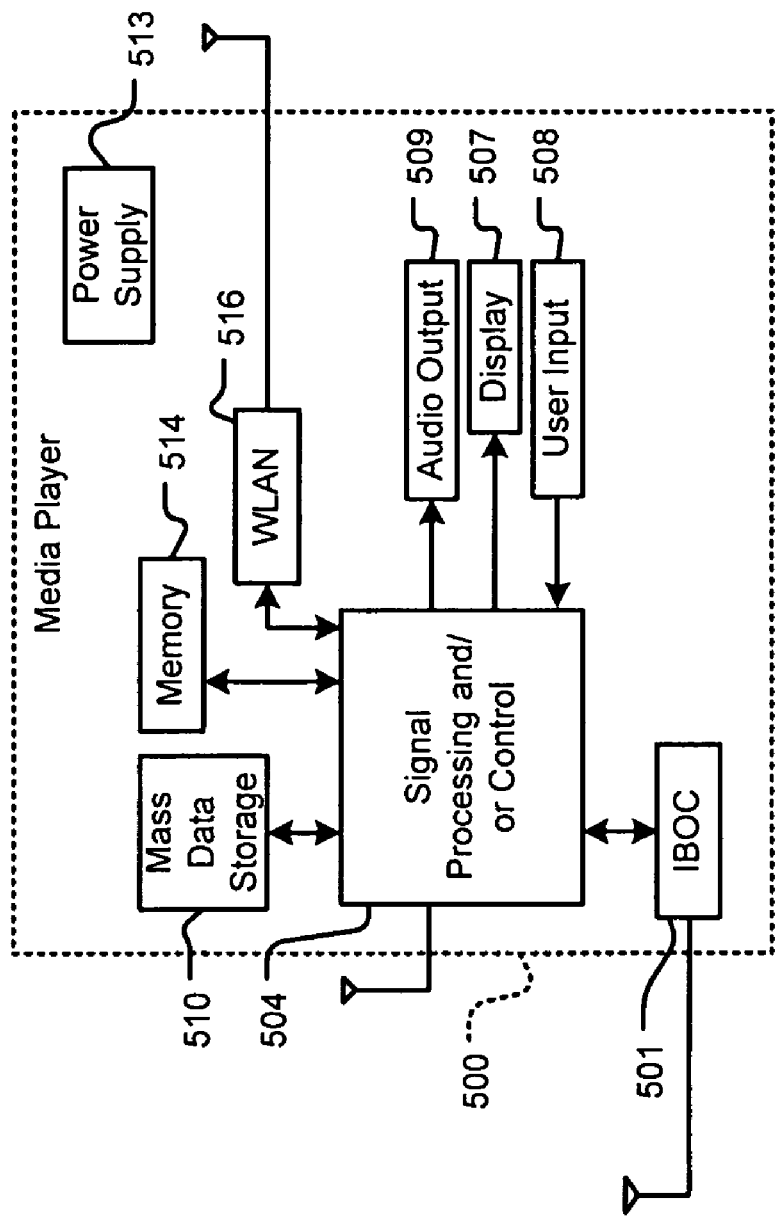
FIG. 10E is a functional block diagram of a media player.

Referring now to FIG. 10E, a receiver 501 can be implemented in a media player 500. In some implementations, the media player 500 includes a display 507 and/or a user input device 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function. The receiver 501 may communicate with the signal processing and/or control circuits 504.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices such as HDDs and/or DVDs. At least one HDD may have the configuration shown in FIG. 9A and/or at least one DVD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. The media player 500 also may include a power supply 513. Still other implementations in addition to those described above are contemplated.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A radio frequency (RF) receiver comprising:
a local oscillator (LO) module configured to (i) receive a control signal and (ii) generate a LO signal at a LO frequency, wherein the LO frequency is generated based on the control signal;
a LO mixer module configured to generate an intermediate frequency (IF) signal based on (i) a radio frequency (RF) signal and (ii) the LO signal;
a complex intermediate frequency (IF) mixer module configured to generate a baseband signal based on (i) the IF signal and (ii) an IF oscillator signal; and
a channel monitoring module configured to generate the control signal based on the baseband signal,
wherein:
the channel monitoring module is configured to sequence the LO frequency through a plurality of frequencies;
the plurality of frequencies include (i) a frequency that is greater than a frequency of the RF signal and (ii) a frequency that is less than the frequency of the RF signal;
for each of the plurality of frequencies, the channel monitoring module is configured to determine a ratio between (i) a wanted signal of the baseband signal and (ii) an image signal of the baseband signal; and
the channel monitoring module generates the control signal based on one of the ratios.

2. The RF receiver of claim 1, wherein the channel monitoring module is configured to:
measure an amplitude of the baseband signal; and
generate the control signal based on the amplitude.

3. The RF receiver of claim 1, wherein the channel monitoring module is configured to:
measure an amplitude of an image channel of the baseband signal; and
generate the control signal based on the amplitude.

4. The RF receiver of claim 1, wherein the channel monitoring module is configured to:
measure an amplitude of a selected channel;
measure an amplitude of an image of the selected channel and of the baseband signal; and
generate the control signal based on (i) the amplitude of the selected channel and (ii) the amplitude of the image.

5. The RF receiver of claim 4, wherein the channel monitoring module is configured to generate the control signal based on a ratio between (i) the amplitude of the selected channel and (ii) the amplitude of the image.

6. The RF receiver of claim 1, wherein the channel monitoring module includes a look-up table that includes N LO frequencies, wherein N is a positive integer.

7. The RF receiver of claim 1, further comprising an analog-to-digital converter configured to digitize the IF signal, wherein the analog-to-digital converter is connected between (i) an output of the LO mixer module and (ii) an input of the IF mixer module.

8. The RF receiver of claim 1, wherein:
the IF signal includes an in-phase (I) signal and a quadrature phase (Q) signal; and
the IF oscillator signal includes a sine signal and a cosine signal.

9. The RF receiver of claim 8, wherein the complex IF mixer module is configured to mix (i) the cosine signal with the I signal and (ii) the sine signal with the Q signal.

10. The RF receiver of Claim 1, wherein:
the channel monitoring module is and the cosine signal generate a polarity control signal; and
based on whether the LO frequency is greater than or less than the frequency of the RF signal, the polarity control signal is used to selectively switch the complex IF mixer module between a high-side injection mode and a low-side injection mode.

11. The RF receiver of claim 10, wherein the channel monitoring module is configured to determine the ratio for each of the plurality of frequencies until one of the ratios exceeds a predetermined ratio.

12. The RF receiver of claim 11, wherein:
the channel monitoring module is configured to set the LO frequency to the one of the plurality of frequencies; and
the one of the plurality of frequencies corresponds with a greatest one of the ratios when none of the ratios exceeds the predetermined ratio.

13. The RF receiver of claim 1, wherein the complex IF mixer module comprises:
a first mixer configured to mix an in-phase signal with a first oscillator signal;
a second mixer configured to mix a quadrature phase signal with the first oscillator signal;
a third mixer configured to mix the in-phase signal with a second oscillator signal; and
a fourth mixer configured to mix the quadrature phase signal with the second oscillator signal,
wherein the IF signal includes the in-phase signal and the quadrature phase signal.

14. The RF receiver of claim 13, further comprising a recombination module comprising:
a first summer configured to generate an in-phase output signal by summing (i) an output of the first mixer with (ii) an output of the fourth mixer; and a second summer configured to generate a quadrature phase output signal by summing (i) an output of the second mixer with (ii) an output of the third mixer.

15. The RF receiver of claim 14, wherein:
the first summer is configured to generate the in-phase output signal by summing (i) the output of the first mixer, (ii) the output of the fourth mixer, and (iii) a polarity control signal; and
the second summer is configured to generate the quadrature phase output signal by summing (i) the output of the second mixer, (ii) the output of the third mixer, and (iii) the polarity control signal.

16. The RF receiver of claim 15, wherein the channel monitoring module is configured to generate the polarity control signal based on filtered versions of the in-phase output signal and the quadrature phase output signal.

17. The RF receiver of claim 13, wherein:
the in-phase signal is an output of a fifth mixer of the LO mixer module; and
the quadrature phase signal is a gain compensated version of an output of a sixth mixer of the LO mixer module.

18. A method of receiving a radio frequency (RF) signal, the method comprising:
receiving a control signal;
generating a local oscillator (LO) signal at a LO frequency, wherein the LO frequency is generated based on the control signal;
generating an intermediate frequency (IF) signal based on (i) the RF signal and (ii) the LO signal;
generating a baseband signal based on (i) the IF signal and (ii) an IF oscillator signal;
generating the control signal based on the baseband signal;
sequencing the LO frequency through a plurality of frequencies, wherein the plurality of frequencies include (i) a frequency that is greater than a frequency of the RF signal and (ii) a frequency that is less than the frequency of the RF signal; and
for each of the plurality of frequencies, determining a ratio between (i) a wanted signal of the baseband signal and (ii) an image signal of the baseband signal, wherein the control signal is generated based on one of the ratios.

19. The method of claim 18, further comprising:
measuring an amplitude of the baseband signal; and
generating the control signal based on the amplitude.

20. The method of claim 18, further comprising:
measuring an amplitude of an image channel of the baseband signal; and
generating the control signal based on the amplitude.

21. The method of claim 18, further comprising:
measuring an amplitude of a selected channel;
measuring an amplitude of an image of the selected channel and of the baseband signal; and
generating the control signal based on (i) the amplitude of the selected channel and (ii) the amplitude of the image.

22. The method of claim 21, further comprising generating the control signal based on a ratio between (i) the amplitude of the selected channel and (ii) the amplitude of the image.

23. The method of claim 18, further comprising selecting the LO frequency from N LO frequencies, wherein N is a positive integer.

24. The method of claim 18, further comprising digitizing the IF signal (i) subsequent to the generating of the IF signal and (ii) prior to the generating of the baseband signal.

25. The method of claim 18, wherein:
the IF signal includes an in-phase (I) signal and a quadrature phase (Q) signal; and
the IF oscillator signal includes a sine signal and a cosine signal.

26. The method of claim 25, wherein generating the baseband signal includes mixing (i) the cosine signal with the I signal and (ii) the sine signal with the Q signal.

27. The method of claim 26, further comprising:
generating an I output signal based on a sum of (i) the I signal mixed with the cosine signal and (ii) the Q signal mixed with the sine signal;
generating a Q output signal based on a difference between (i) the Q signal mixed with the cosine signal and (ii) the I signal mixed with the sine signal; and
the baseband signal includes the I output signal and the Q output signal.

28. The method of claim 26, further comprising equalizing amplitudes of the I signal and the Q signal.

29. The method of claim 18, further comprising, based on whether the LO frequency is greater than or less than the frequency of the RF signal, generating the baseband signal during one of a high-side injection mode and a low-side injection mode.

30. The method of claim 29, further comprising determining the ratio for each of the plurality of frequencies until one of the ratios exceeds a predetermined ratio.

31. The method of claim 30, further comprising setting the LO frequency to the one of the plurality of frequencies, wherein the one of the plurality of frequencies corresponds with a greatest one of the ratios when none of the ratios exceeds the predetermined ratio.

32. A radio frequency (RF) receiver comprising:
local oscillator (LO) means for (i) receiving a control signal and (ii) generating a LO signal at a LO frequency, wherein the LO frequency is generated based on the control signal;
LO mixer means for generating an intermediate frequency (IF) signal based on (i) a radio frequency (RF) signal and (ii) the LO signal;
Complex intermediate frequency (IF) mixer means for generating a baseband signal based on (i) the IF signal and (ii) an IF oscillator signal; and
Channel monitoring means for generating the control signal based on the baseband signal,
wherein:
the channel monitoring means sequences the LO frequency through a plurality of frequencies;
the plurality of frequencies include (i) a frequency that is greater than a frequency of the RF signal and (ii) a frequency that is less than the frequency of the RF signal;
for each of the plurality of frequencies, the channel monitoring means determines a ratio between a wanted signal of the baseband signal and an image signal of the baseband signal; and
the channel monitoring means generates the control signal based on one of the ratios.

33. The RF receiver of claim 32, wherein the channel monitoring means:
measures an amplitude of the baseband signal; and
generates the control signal based on the amplitude.

34. The RF receiver of claim 32, wherein the channel monitoring means:
measures an amplitude of an image channel of the baseband signal; and
generates the control signal based on the amplitude.

35. The RF receiver of claim 32, wherein the channel monitoring means:
   measures an amplitude of a selected channel;
   measures an amplitude of an image of the selected channel and of the baseband signal; and
   generates the control signal based on (i) the amplitude of a selected channel and (ii) the amplitude of an image.

36. The RF receiver of claim 35, wherein the channel monitoring means generates the control signal based on a ratio between (i) the amplitude of the selected channel and (ii) the amplitude of the image.

37. The RF receiver of claim 32, wherein the channel monitoring means includes a look-up table that includes N LO frequencies, wherein N is a positive integer.

38. The RF receiver of claim 32, further comprising analog-to-digital converter means for digitizing the IF signal, wherein the analog-to-digital converter means is connected between (i) an output of the LO mixer means and (ii) an input of the IF mixer means.

39. The RF receiver of claim 32, wherein:
   the IF signal includes an in-phase (I) signal and a quadrature phase (Q) signal; and
   the IF oscillator signal includes a sine signal and a cosine signal.

40. The RF receiver of claim 39, wherein the complex IF mixer means mixes (i) the cosine signal with the I signal and (ii) the sine signal with the Q signal.

41. The RF receiver of claim 39, wherein:
   the IF mixer means includes a recombination means for generating an I output signal based on a sum of (i) the I signal mixed with the cosine signal and (ii) the Q signal mixed with the sine signal; and
   the recombination means generates a Q output signal based on a difference between (i) the Q signal mixed with the cosine signal and (ii) the I signal mixed with the sine signal; and
   the baseband signal includes the I output signal and the Q output signal.

42. The RF receiver of claim 39, further comprising gain means for equalizing amplitudes of the I signal and the Q signal.

43. The RF receiver of claim 32, wherein:
   the channel monitoring means generates a polarity control signal; and
   based on whether the LO frequency is greater than or less than the frequency of the RF signal, the polarity control signal is used to selectively switch the complex IF mixer module between a high-side injection mode and a low-side injection mode.

44. The RF receiver of claim 43, wherein the channel monitoring means determines the ratio for each of the plurality of frequencies until one of the ratios exceeds a predetermined ratio.

45. The RF receiver of claim 44, wherein the channel monitoring means sets the LO frequency to the one of the plurality of frequencies that corresponds with a greatest one of the ratios when none of the ratios exceeds the predetermined ratio.

* * * * *